(12) United States Patent
Kim et al.

(10) Patent No.: US 8,368,465 B2
(45) Date of Patent: Feb. 5, 2013

(54) POWER AMPLIFICATION APPARATUS

(75) Inventors: Bum Man Kim, Pohang-si (KR); Dae Hyun Kang, Pohang-si (KR)

(73) Assignee: Postech Academy-Industry Foundation, Pohang-Si, Gyeongsangbuk-Do (KR)

( * ) Notice: Subject to any disclaimer, the term of this patent is extended or adjusted under 35 U.S.C. 154(b) by 0 days.

(21) Appl. No.: 13/113,441

(22) Filed: May 23, 2011

(65) Prior Publication Data

US 2012/0126891 A1 May 24, 2012

(30) Foreign Application Priority Data

Nov. 23, 2010 (KR) ........................ 10-2010-0117112

(51) Int. Cl.
*H03F 1/56* (2006.01)
(52) U.S. Cl. ...................... 330/124 R; 330/295; 330/286
(58) Field of Classification Search .................. 330/295, 330/124 R, 84, 286, 53
See application file for complete search history.

(56) References Cited

U.S. PATENT DOCUMENTS

| | | | | |
|---|---|---|---|---|
| 7,078,976 B2 * | 7/2006 | Blednov | .................... | 330/286 |
| 7,800,448 B2 * | 9/2010 | Blednov | .................... | 330/295 |

FOREIGN PATENT DOCUMENTS

JP 2009-239882 A 10/2009

OTHER PUBLICATIONS

Kang, D., Kim, D., Moon, J., & Kim, B., "Broadband HBT Doherty Power Amplifiers for Handset Applications." IEEE Transactions on Microwave Theory and Techniques, originally presented at IEEE MTT-S Int. Microwave Symposium, May 23-28, 2010 in Anaheim, CA, pp. 1-9.
Kang, D., Choi, J., Kim, D., Yu, D., Min, K., Kim, B., "30.3% PAE HBT Doherty Power Amplifier for 2.5~2.7 GHz Mobile WiMAX", Microwave Symposium Digest (MTT), 2010 IEE MTT-S International, Anaheim, CA, May 23-28, 2010, pp. 1-4.

* cited by examiner

*Primary Examiner* — Hieu Nguyen
(74) *Attorney, Agent, or Firm* — Kile Park Goekjian Reed & McManus PLLC

(57) ABSTRACT

A power amplification apparatus includes a first amplifier turned on at a preset low input power; and a second amplifier connected in parallel with the first amplifier and turned off at a low input power due to a relatively low bias current. Output capacitors of the first amplifier and the second amplifier are compensated for by inductors or microstrip lines of dc power supply paths. An output matching circuit of the first amplifier includes a $\lambda/4$ transformer. An output matching circuit of the second amplifier has the phase of $0°$. Input matching circuits of the first amplifier and the second amplifier include delay compensation circuits. The output matching circuit of the first amplifier, the output matching circuit of the second amplifier, and a final output matching circuit have the same impedance transformation rates.

7 Claims, 6 Drawing Sheets

POWER AMPLIFICATION APPARATUS

BACKGROUND OF THE INVENTION

1. Field of the Invention

The present invention relates to a broadband parallel power amplification apparatus, and more particularly, to a power amplification apparatus in which output matching impedance transformation rates are equalized and a quarter-wave circuit and a delay compensation circuit are included in input/output matching circuits to be advantageous for operation in a broadband frequency.

2. Description of the Related Art

As is generally known in the art, recently, research has been conducted to improve the efficiency of a mobile communication terminal. In particular, research for a Doherty power amplifier capable of improving efficiency has been actively conducted.

The Doherty power amplifier is devised by W. K. Doherty in 1936. In the Doherty power amplifier, a carrier amplifier and a peaking amplifier are connected in parallel. The output load impedance of the carrier amplifier is controlled by changing the amount of current flowing through the peaking amplifier according to an output power level to improve efficiency.

Hereafter, a conventional power amplification apparatus will be described with reference to the attaching drawing.

FIG. 1 is a circuit diagram showing an exemplary Doherty power amplification apparatus among conventional power amplification apparatuses. The power amplification apparatus includes an input divider 11, a delay compensation circuit 12, input matching circuits 13 of carrier and peaking amplifiers, a carrier amplifier 14, a peaking amplifier 15, first output matching circuits 16 of the carrier and peaking amplifiers, offset lines 17 of the carrier and peaking amplifiers, a quarter wave circuit (a λ/4 transformer) 18, and a second output matching circuit 19 which connects power amplification apparatuses connected in parallel and outputs a final output power.

The Doherty power amplification apparatus shown in FIG. 1 changes the load impedance of the carrier amplifier 14 using the λ/4 transformer 18 and thereby improves efficiency.

The delay compensation circuit 12 compensates for the delay that has occurred by the λ/4 transformer 18.

The offset lines 17 are to compensate for internal capacitor components of the output terminals of the carrier amplifier 14 and the peaking amplifier 15. The offset lines 17 function to appropriately change the load impedance of the carrier amplifier 14 and prevent current from flowing into the peaking amplifier 15 at a low output power.

In the conventional power amplification apparatus, the efficiency of an output terminal is improved using the output matching circuits, the λ/4 transformer for adjusting output load impedance and the offset lines for perfect load impedance change. However, a problem is caused in that a broadband operation is limited due to the presence of the λ/4 transformer and the offset lines. Also, while the delay compensation circuit for compensating a delay occurring due to the λ/4 transformer is positioned at the input end of the second amplifier, the delay compensation circuit restricts the broadband operation of the power amplification apparatus connected in parallel.

SUMMARY OF THE INVENTION

Accordingly, the present invention has been made in an effort to solve the problems occurring in the related art, and an object of the present invention is to provide a power amplification apparatus in which a delay compensation circuit is included in an input matching circuit, an offset line is removed through compensating for an output capacitor component in a device by an inductor or a microstrip line of a dc power supply path, and a λ/4 transformer is included in an output matching circuit, thereby enabling the high efficiency broadband operation of power amplification apparatuses connected in parallel.

Another object of the present invention is to provide a power amplification apparatus in which impedance transformation rates of a first output matching circuit, a second output matching circuit and a third output matching circuit are equalized to maximize an operation frequency band.

In order to achieve the above object, according to the present invention, there is provided a power amplification apparatus including: a first amplifier turned on at a preset low input power; and a second amplifier connected in parallel with the first amplifier and turned off at a low input power due to a relatively low bias current, wherein output capacitors of the first amplifier and the second amplifier are compensated for by inductors or microstrip lines of dc power supply paths, wherein an output matching circuit of the first amplifier includes a λ/4 transformer, wherein an output matching circuit of the second amplifier has the phase of 0°, wherein input matching circuits of the first amplifier and the second amplifier include delay compensation circuits, and wherein the output matching circuit of the first amplifier, the output matching circuit of the second amplifier, and a final output matching circuit have the same impedance transformation rates.

In a preferred embodiment of the present invention, the output matching circuit of the second amplifier includes: a first inductor connected in series with an output of the second amplifier; a first capacitor having one end which is connected with the other end of the first inductor and the other end which is grounded; a second capacitor having one end which is connected with the other end of the first inductor and the other end which is connected with an output of the output matching circuit of the first amplifier; and a second inductor having one end which is connected with the other end of the second capacitor and the other end which is grounded.

In another preferred embodiment of the present invention, the output matching circuit of the second amplifier includes: a first capacitor connected in series with an output of the second amplifier; a first inductor having one end which is connected with the other end of the first capacitor and the other end which is grounded; a second inductor having one end which is connected with the other end of the first capacitor and the other end which is connected with an output of the output matching circuit of the first amplifier; and a second capacitor having one end which is connected with the other end of the second inductor and the other end which is grounded.

In another preferred embodiment of the present invention, the input matching circuit requiring the phase of 0° includes: a first inductor connected in series with an input of the first or second amplifier; a first capacitor having one end which is connected with the other end of the first inductor and the other end which is grounded; a second capacitor having one end which is connected with the other end of the first inductor and the other end which is connected with an output of a power divider; and a second inductor having one end which is connected with the other end of the second capacitor and the other end which is grounded.

In another preferred embodiment of the present invention, the input matching circuit requiring the phase of 0° includes:

a first capacitor connected in series with an input of the first or second amplifier; a first inductor having one end which is connected with the other end of the first capacitor and the other end which is grounded; a second inductor having one end which is connected with the other end of the first capacitor and the other end which is connected with an output of a power divider; and a second capacitor having one end which is connected with the other end of the second inductor and the other end which is grounded.

In another preferred embodiment of the present invention, the input matching circuit requiring the phase of +90° includes: a first capacitor connected in series with an input of the first or second amplifier; a first inductor having one end which is connected with the other end of the first capacitor and the other end which is grounded; a second capacitor having one end which is connected with the other end of the first capacitor and the other end which is connected with an output of a power divider; and a second inductor having one end which is connected with the other end of the second capacitor and the other end which is grounded.

In another preferred embodiment of the present invention, the input matching circuit requiring the phase of −90° includes: a first inductor connected in series with an input of the first or second amplifier; a first capacitor having one end which is connected with the other end of the first inductor and the other end which is grounded; a second inductor having one end which is connected with the other end of the first inductor and the other end which is connected with an output of a power divider; and a second capacitor having one end which is connected with the other end of the second inductor and the other end which is grounded.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
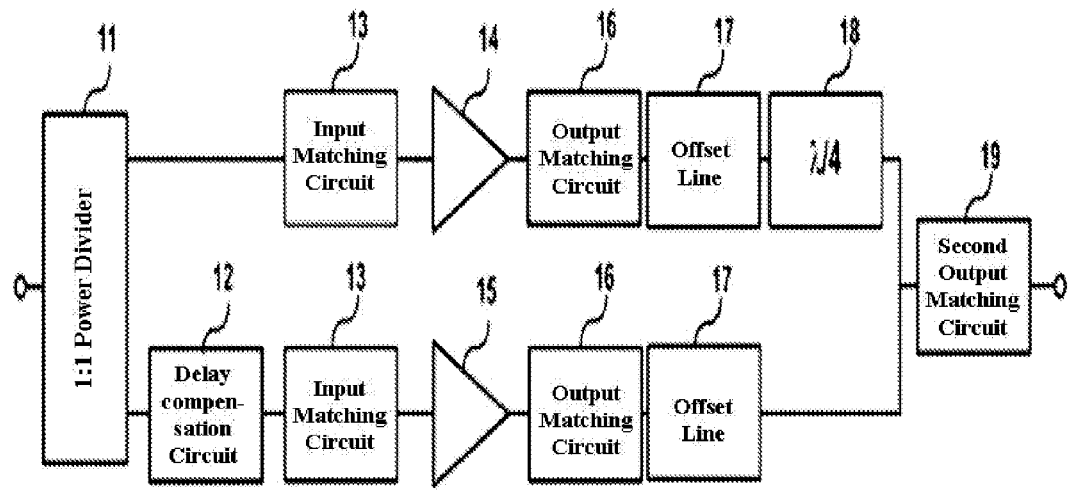
FIG. 1 is a circuit diagram showing an exemplary Doherty power amplification apparatus among conventional power amplification apparatuses.

Reference will now be made in greater detail to a preferred embodiment of the invention, an example of which is illustrated in the accompanying drawings. Wherever possible, the same reference numerals will be used throughout the drawings and the description to refer to the same or like parts.

In an exemplary embodiment of the present invention, description will be made for a power amplification apparatus, in which an additional delay compensation circuit is included in an input matching circuit, a λ/4 transformer is included in an output matching circuit, and an inductor or a microstrip line of a dc power supply path is used to serve as an offset line, so that the number and the sizes of devices can be decreased and high efficiency broadband operations are enabled.

Figure 2:
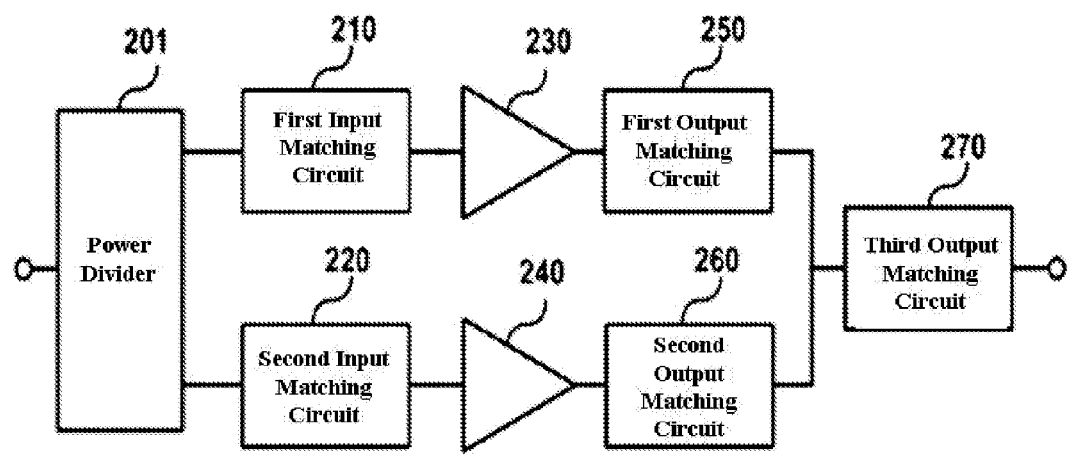
FIG. 2 is a configuration diagram showing a power amplification apparatus in accordance with an embodiment of the present invention, which has an input matching circuit including a delay compensation circuit and an output matching circuit including a λ/4 transformer, for a broadband operation.

FIG. 2 is a diagram showing a power amplification apparatus in accordance with an embodiment of the present invention. The power amplification apparatus includes a power divider 201, a first amplifier 230, a second amplifier 240, first and second input matching circuits 210 and 220, and first, second and third output matching circuits 250, 260 and 270.

The power divider 201 is positioned in front of the first and second input matching circuits 210 and 220, and functions to appropriately divide an input power to the first amplifier 230 and the second amplifier 240.

The first amplifier 230 is amplification means of which input impedance change depending upon a magnitude of an applied power is less than a preset range, and may include, for example, a carrier amplifier. That is to say, the input impedance of the carrier amplifier depending upon a level of applied power changes to a less extent due to a high bias. The first input matching circuit 210 for input matching is disposed in front of the first amplifier 230. The second amplifier 240 is connected in parallel with the first amplifier 230, and may include, for example, a peaking amplifier. That is to say, the input impedance of the peaking amplifier depending upon a level of applied power changes to a greater extent due to a low bias. The second input matching circuit 220 for input matching is disposed in front of the second amplifier 240.

The first output matching circuit 250 is positioned at the output end of the first amplifier 230. The first output matching circuit 250 is configured in the form of a λ/4 transformer to simultaneously enable output matching and impedance transformation for a Doherty operation.

The second output matching circuit 260 is positioned at the output end of the second amplifier 240 and is constituted by a matching circuit which has the phase of 0° and performs impedance transformation.

The third output matching circuit 270 connects the first output matching circuit 250 on the path of the first amplifier 230 with the second output matching circuit 260 on the path of the second amplifier 240, and transforms the output impedances of the power amplifiers.

Figure 3:
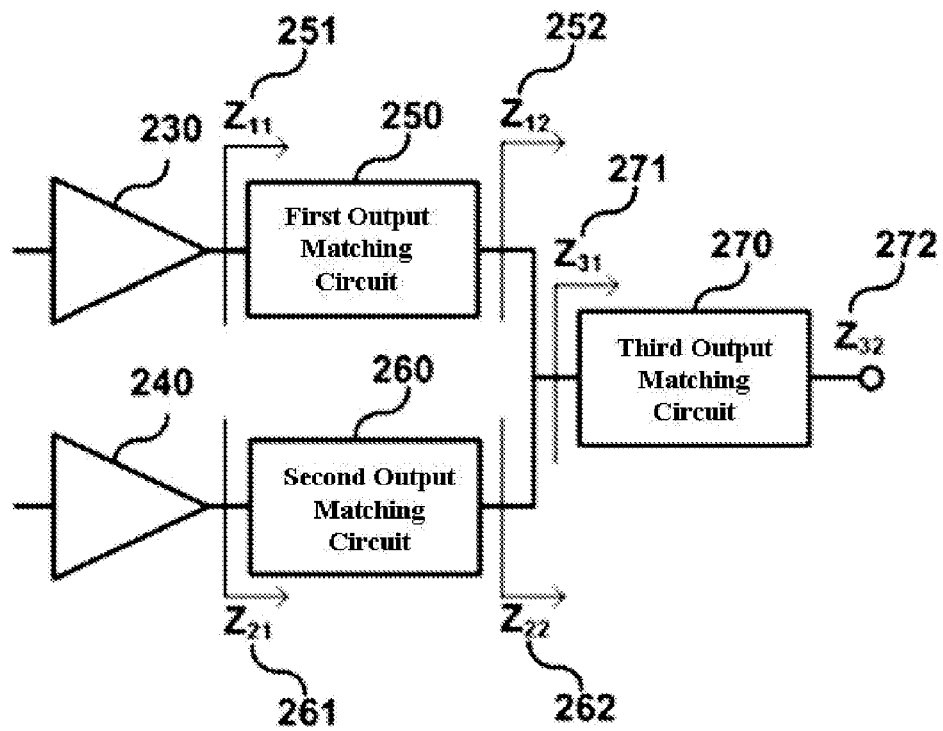
FIG. 3 is a diagram explaining the impedance transformation rates of output matching circuits according to the present invention.

The impedance transformation rates of the first, second and third output matching circuits in the power amplification apparatus configured as mentioned above will be described below with reference to FIG. 3.

The impedance transformation rates of the first output matching circuit 250, the second output matching circuit 260 and the third output matching circuit 270 are equalized in such a manner that broadband matching is accomplished. In an example, when assuming that a target output impedance of the first amplifier 230 is Z1Ω as designated by the reference numeral 251, a target output impedance of the second amplifier 240 is Z21Ω as designated by the reference numeral 261 and the final end impedance of the parallel power amplifiers is Z32Ω as designated by the reference numeral 272, the impedance transformation rates of the respective output matching circuits are expressed as in the following Mathematical Expression 1.

$$Z12/Z11 = Z22/Z21 = Z32/Z31$$ [Mathematical Expression 1]

Figure 4:
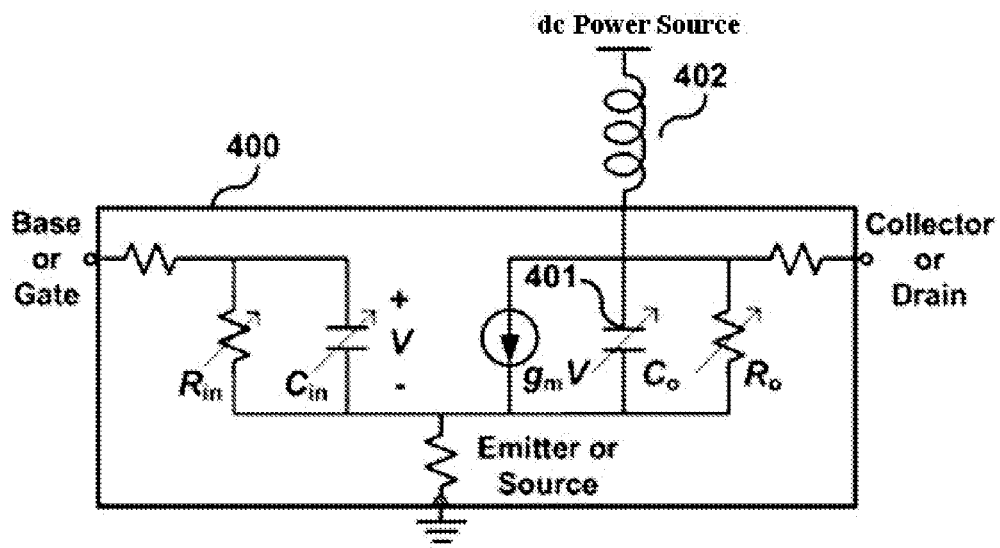
FIG. 4 is a circuit diagram explaining removal of offset lines and compensation of output capacitors according to the present invention.

FIG. 4 is a circuit diagram explaining that the effects of offset lines in the conventional art may be achieved by the inductors or microstrip lines of dc power supply paths. In the case of a high efficiency power amplification apparatus connected in parallel, load impedance change cannot be perfectly implemented by an output capacitor 401 in a transistor 400, and as unnecessary current flows toward the path of the second amplifier 240 at a low output power, high efficiency performance cannot be achieved. Accordingly, in order to compensate for the output capacitor 401 of the first amplifier 230 and the second amplifier 240, an inductor or a microstrip line which has an inductance value that satisfies the following Mathematical Expression 2 is connected.

$$L = \frac{1}{4\pi^2 f_0^2 C}$$ [Mathematical Expression 2]

FIGS. 5a to 5d are diagrams showing exemplary phases of respective input matching circuits and output matching circuits according to the present invention.

Figure 5A:
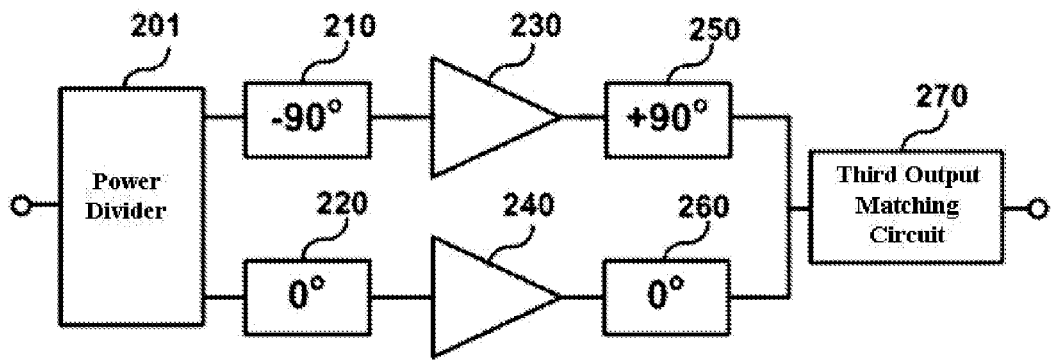
FIGS. 5a to 5d are diagrams explaining the phases of respective input matching circuits and output matching circuits for removal of a delay compensation circuit according to the present invention.

Describing, with reference to FIG. 5a, the power amplification apparatus in which the phases of the input and output matching circuits are determined in the way stated above, because the output capacitor 401 compensated by the inductor or the microstrip line should be kept compensated, the second output matching circuit 260 has only the phase of 0°. If the second output matching circuit 260 has the phase of 90°, since current leaks from the first output matching circuit 250 toward the second output matching circuit 250 at a low output power, it is impossible to maintain high efficiency characteristics. Also, the first output matching circuit 250 includes the λ/4 transformer. Because the first output matching circuit 250 performs impedance matching, the phase thereof is 90° or −90°. As the first output matching circuit 250 has the phase of −90°, the phase of 0° is realized at the input of the third output matching circuit 270 and the phase of the second input matching circuit 220 on the path of the second amplifier 240 is realized as 0°, by which the input of the third output matching circuit 270 has the phase of 0°. Accordingly, as powers with the same phase are summed at the input terminal of the third output matching circuit 270, a maximum output power can be acquired at the output terminal of the third output matching circuit 270.

Figure 5B:
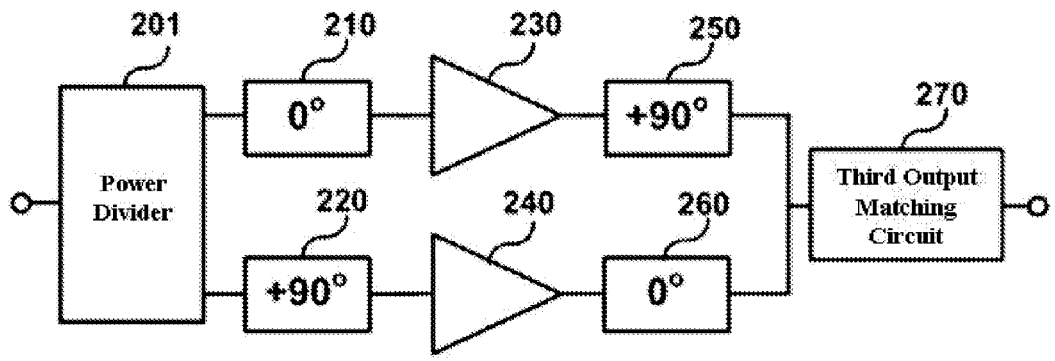

FIG. 5b represents the case in which the phase of the first output matching circuit 250 is +90° and the phase of the first input matching circuit 210 is 0°, and therefore the phase of the second input matching circuit 220 is realized as +90°.

Figure 5C:
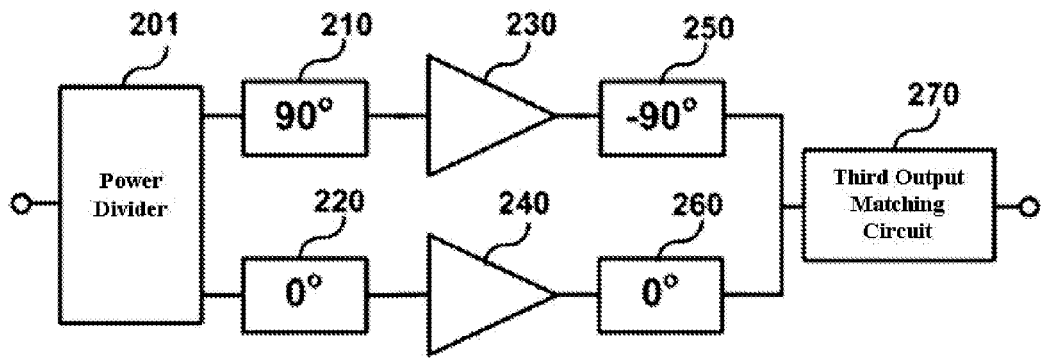

FIG. 5c represents the case in which the phase of the first output matching circuit 250 is −90° and the phase of the first input matching circuit 210 is +90°, and therefore the phase of the second input matching circuit 220 is realized as 0°.

Figure 5D:
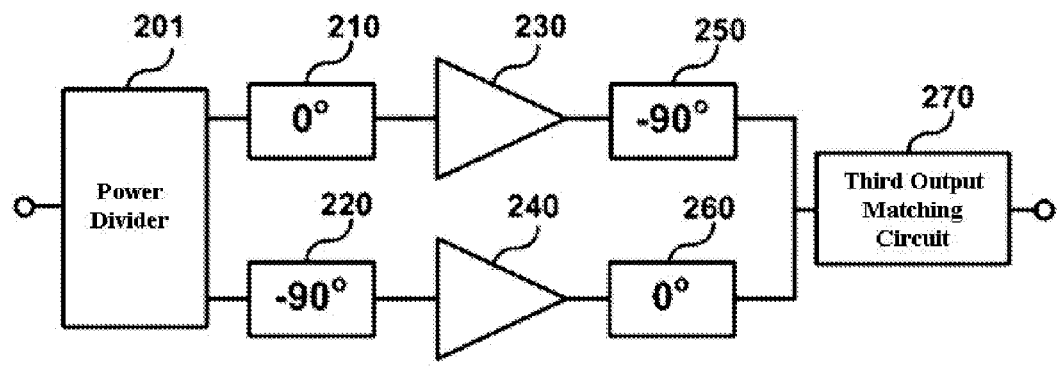

FIG. 5d represents the case in which the phase of the first output matching circuit 250 is −90° and the phase of the first input matching circuit 210 is 0°, and therefore, the phase of the second input matching circuit 220 is realized as −90°.

Figure 6A:
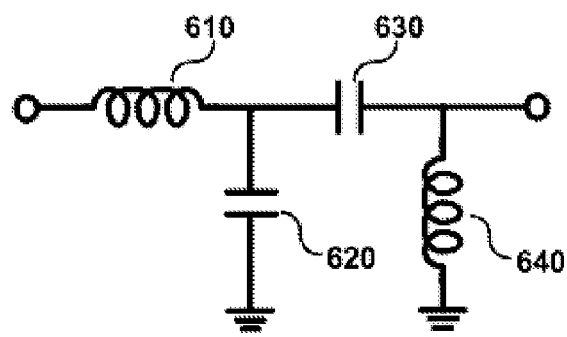
FIGS. 6a and 6b are circuit diagrams explaining output matching circuits which have the phase of 0° and implement output matching in the power amplification apparatus according to the present invention.

Observing the second output matching circuit 260 with the phase of 0° with reference to FIG. 6a, FIG. 6a represents an example in which impedance matching is implemented twice so as to accomplish desired impedance matching and broadband characteristics and the phase of 0° is finally realized via the phases of −45° and +45°.

Figure 6B:
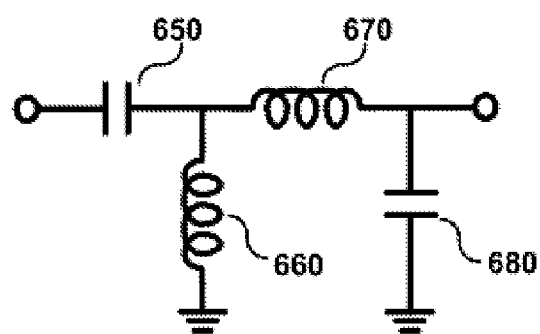

FIG. 6b represents an example in which broadband characteristics are accomplished through two times matching and the phase of 0° is finally realized via the phases of +45° and −45°.

Figure 7A:
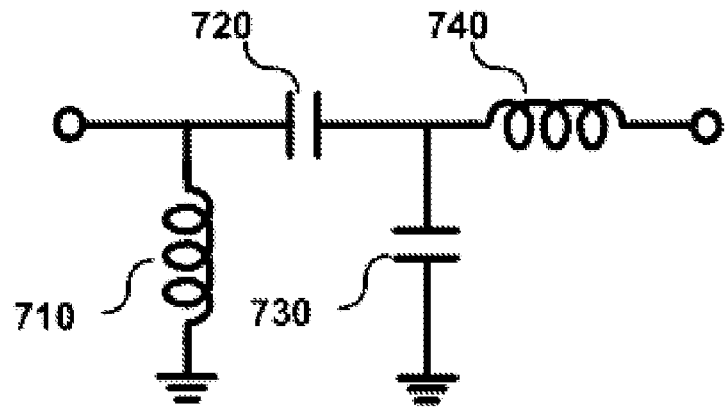
FIGS. 7a and 7b are circuit diagrams explaining input matching circuits which have the phase of 0° and implement output matching in the power amplification apparatus according to the present invention.
Figure 7B:
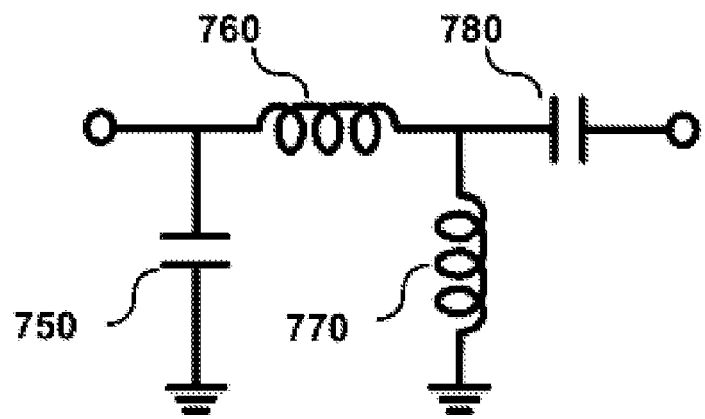

Each of FIGS. 7a and 7b represents an example in which broadband characteristics are accomplished through two times matching and the phase of 0° is finally realized via the phases of +45° and −45°, and which can be applied to the input matching circuit 210 of the first amplifier 230 or the input matching circuit 220 of the second amplifier 240.

Figure 8A:
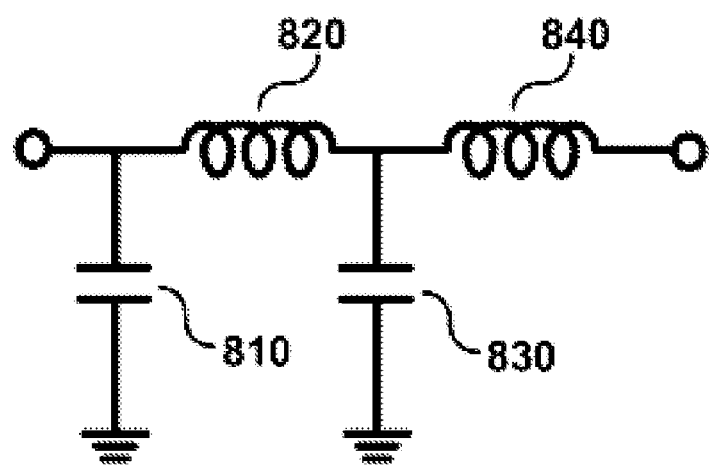
FIGS. 8a and 8b are circuit diagrams explaining input matching circuits which have the respective phases of −90° and +90° and implement output matching in the power amplification apparatus according to the present invention.

FIG. 8a represents an example in which broadband characteristics are accomplished through two times matching and the phase of 90° is finally realized via the phases of +45° and +45°, and which can be applied to the input matching circuit 210 of the first amplifier 230 or the input matching circuit 220 of the second amplifier 240.

Figure 8B:
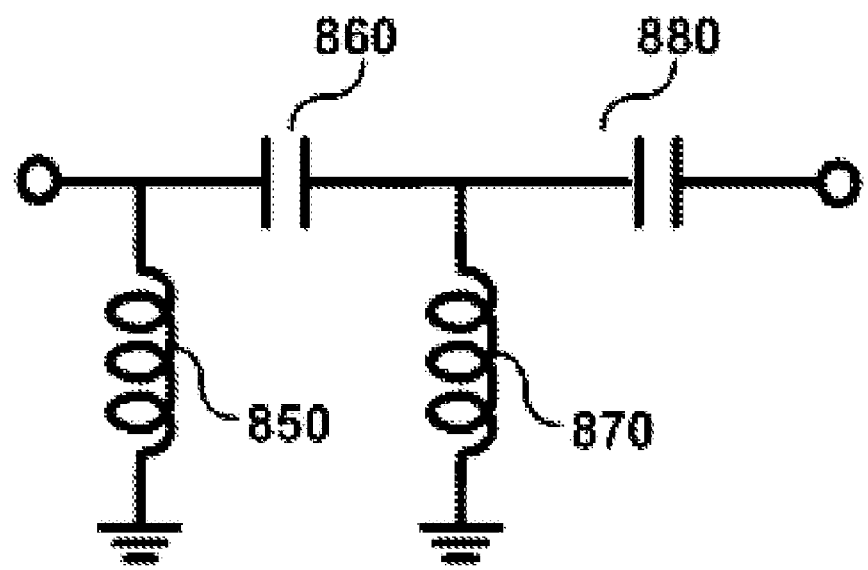

FIG. 8b represents an example in which broadband characteristics are accomplished through two times matching and the phase of −90° is finally realized via the phases of −45° and −45°, and which can be applied to the input matching circuit 210 of the first amplifier 230 or the input matching circuit 220 of the second amplifier 240.

As is apparent from the above description, the power amplification apparatus according to the present invention provides advantages in that, since an additional delay compensation circuit and a λ/4 transformer are respectively included in an input matching circuit and an output matching circuit, high efficiency broadband operations are enabled.

Also, in the present invention, because offset lines are removed through compensating for output capacitor components in devices by inductors or microstrip lines of dc power supply paths of first and second amplifiers, the number and the size of devices can be decreased, and broadband operations are enabled.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A power amplification apparatus comprising:
a first amplifier turned on at a preset low input power; and
a second amplifier connected in parallel with the first amplifier and turned off at a low input power due to a relatively low bias current,
wherein output capacitors of the first amplifier and the second amplifier are compensated for by inductors or microstrip lines of dc power supply paths,
wherein a first output matching circuit coupled to the first amplifier includes a λ4 transformer,
wherein a second output matching circuit coupled to the second amplifier has the phase of 0°,
wherein a first input matching circuit coupled to the first amplifier and a second input matching circuit coupled to the second amplifier each include a delay compensation circuit, and
wherein the first output matching circuit of the first amplifier, the second output matching circuit of the second amplifier, and a third output matching circuit have the same impedance transformation rates.

2. The power amplification apparatus according to claim 1, wherein the second output matching circuit coupled to the second amplifier comprises:
- a first inductor connected in series with an output of the second amplifier;
- a first capacitor having one end which is connected with the other end of the first inductor and the other end which is grounded;
- a second capacitor having one end which is connected with the other end of the first inductor and the other end which is connected with an output of the output matching circuit of the first amplifier; and
- a second inductor having one end which is connected with the other end of the second capacitor and the other end which is grounded.

3. The power amplification apparatus according to claim 1, wherein the second output matching circuit coupled to the second amplifier comprises:
- a first capacitor connected in series with an output of the second amplifier;
- a first inductor having one end which is connected with the other end of the first capacitor and the other end which is grounded;
- a second inductor having one end which is connected with the other end of the first capacitor and the other end which is connected with an output of the output matching circuit of the first amplifier; and
- a second capacitor having one end which is connected with the other end of the second inductor and the other end which is grounded.

4. The power amplification apparatus according to claim 1, wherein the first input matching circuit is configured to require a phase of 0° comprises:
- a first inductor connected in series with an input of the first or second amplifier;
- a first capacitor having one end which is connected with the other end of the first inductor and the other end which is grounded;
- a second capacitor having one end which is connected with the other end of the first inductor and the other end which is connected with an output of a power divider; and
- a second inductor having one end which is connected with the other end of the second capacitor and the other end which is grounded.

5. The power amplification apparatus according to claim 1, wherein the second input matching circuit is configured to require a phase of 0° comprises:
- a first capacitor connected in series with an input of the first or second amplifier;
- a first inductor having one end which is connected with the other end of the first capacitor and the other end which is grounded;
- a second inductor having one end which is connected with the other end of the first capacitor and the other end which is connected with an output of a power divider; and
- a second capacitor having one end which is connected with the other end of the second inductor and the other end which is grounded.

6. The power amplification apparatus according to claim 1, wherein the first or second input matching circuit is configured to require a phase of +90° comprises:
- a first capacitor connected in series with an input of the first or second amplifier;
- a first inductor having one end which is connected with the other end of the first capacitor and the other end which is grounded;
- a second capacitor having one end which is connected with the other end of the first capacitor and the other end which is connected with an output of a power divider; and
- a second inductor having one end which is connected with the other end of the second capacitor and the other end which is grounded.

7. The power amplification apparatus according to claim 1, wherein the first or second input matching circuit is configured to require a phase of −90° comprises:
- a first inductor connected in series with an input of the first or second amplifier;
- a first capacitor having one end which is connected with the other end of the first inductor and the other end which is grounded;
- a second inductor having one end which is connected with the other end of the first inductor and the other end which is connected with an output of a power divider; and
- a second capacitor having one end which is connected with the other end of the second inductor and the other end which is grounded.

* * * * *